United States Patent
Liu et al.

(10) Patent No.: US 9,190,990 B1
(45) Date of Patent: Nov. 17, 2015

(54) HIGH-VOLTAGE LEVEL CONVERSION CIRCUIT

(71) Applicant: ILI TECHNOLOGY CORP., Hsinchu County (TW)

(72) Inventors: Hsi-En Liu, Kaohsiung (TW); Sung-Yau Yeh, Hsinchu County (TW)

(73) Assignee: ILI TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 14/464,741

(22) Filed: Aug. 21, 2014

(30) Foreign Application Priority Data

May 21, 2014 (TW) .............................. 103117750 A

(51) Int. Cl.
*H03L 5/00* (2006.01)
*H03K 5/02* (2006.01)
*H03K 19/0185* (2006.01)

(52) U.S. Cl.
CPC ............ *H03K 5/023* (2013.01); *H03K 19/0185* (2013.01)

(58) Field of Classification Search
None
See application file for complete search history.

(56) References Cited

U.S. PATENT DOCUMENTS

| 7,741,882 | B1 | 6/2010 | Ray | |
| 2009/0315610 | A1* | 12/2009 | Han | G09G 3/3696 327/333 |
| 2012/0133415 | A1* | 5/2012 | Oh | H03K 3/356182 327/333 |
| 2012/0313684 | A1* | 12/2012 | Cheng | H03K 3/356182 327/333 |

FOREIGN PATENT DOCUMENTS

TW 201251329 A1 12/2012

* cited by examiner

*Primary Examiner* — Long Nguyen
(74) *Attorney, Agent, or Firm* — Li & Cai Intellectual Property (USA) Office

(57) ABSTRACT

The present disclosure provides a high-voltage level conversion circuit at least comprising a first NMOS transistor, a first PMOS transistor, a second NMOS transistor, a second PMOS transistor, a third PMOS transistor, a third NMOS transistor, a fourth PMOS transistor and a fourth NMOS transistor for receiving an input signal have a first voltage level and a second voltage level and converting the input signal to an output signal having a third voltage level and a fourth voltage level. Compared to conventional high-voltage level conversion circuits the provided high-voltage level conversion circuit occupies less circuit area.

10 Claims, 7 Drawing Sheets

HIGH-VOLTAGE LEVEL CONVERSION CIRCUIT

BACKGROUND OF THE INVENTION

1. Field of the Invention

The instant disclosure relates to a high-voltage level conversion circuit; in particular, to a high-voltage level conversion circuit that needs less circuit area.

2. Description of Related Art

Please refer to FIG. 1 showing a schematic of a conventional high-voltage level conversion circuit. The conventional high-voltage level conversion circuit 1 has a first stage circuit 110 and a second stage circuit 120. The input voltage of the first stage circuit 110 is the first voltage level VSS or the second voltage level VDD, wherein VDD>VSS. The first stage circuit 110 comprises NMOS transistors 111, 112 and PMOS transistors 113, 114. The second stage circuit 120 comprises NMOS transistors 121, 122 and PMOS transistors 123, 124. The circuit of the first stage circuit 110 and the second stage circuit 120 are depicted in FIG. 1.

The first stage circuit 110 converts VDD or VSS of the input signal to the third voltage level VGH or VSS for output, wherein VGH is corresponding to VDD. In other words, the first stage circuit 110 maintains VSS (that VSS is not changed), and converts the high-voltage level (which is VDD) of the input signal to VGH.

Further, the second stage circuit 120 respectively converts VSS and the VGH of the input signal (coming from the first stage circuit 110) to the fourth voltage level VGL and the VGH, wherein VGL is corresponding to VSS. In other words, the second stage circuit 120 maintains VGH and converts the low voltage level (which is VSS) of the input signal to VGL.

However, in order to meet the required transition ability and response speed, the NMOS transistors 111, 112 and the PMOS transistor 123, 124 usually need to provide wider channel width for providing larger current, therefore the circuit area is dominated by the NMOS transistors 111, 112 and the PMOS transistors 123, 124. Accordingly, the larger circuit area causes more manufacturing cost of the circuit.

SUMMARY OF THE INVENTION

The object of the instant disclosure is to provide a high-voltage level conversion circuit for converting an input signal with low voltage level to a high-voltage level signal.

In order to achieve the aforementioned objects, according to an embodiment of the instant disclosure, a high-voltage level conversion circuit is offered. The high-voltage level conversion circuit comprises a first NMOS transistor, a first PMOS transistor, a second NMOS transistor, a second PMOS transistor, a third PMOS transistor, a third NMOS transistor, a fourth PMOS transistor, and a fourth NMOS transistor. The gate of the first NMOS transistor is connected to an input terminal for receiving an input signal. The source of the first NMOS transistor is connected to a first voltage level, wherein the input signal comprises the first voltage level and a second voltage level. The gate of the first PMOS transistor is connected to the input terminal for receiving the input signal. The source of the first PMOS transistor is connected to the second voltage level. The drain of the second NMOS transistor is connected to the drain of the first PMOS transistor. The gate and the drain of the second NMOS transistor are connected together, thus the voltage across the second NMOS transistor is at least a threshold voltage when the second NMOS transistor is conducted. The drain of the second PMOS transistor is connected to the drain of the first NMOS transistor. The gate and the drain of the second PMOS transistor are connected together, thus the voltage across the second PMOS transistor is at least a threshold voltage when the second PMOS transistor is conducted. The drain of the third PMOS transistor is connected to the source of the second PMOS transistor. The source of the third PMOS transistor is connected to a third voltage level. The drain of the third NMOS transistor is connected the source of the second NMOS transistor. The source of the third NMOS transistor is connected to a fourth voltage level. The gate of the fourth PMOS transistor is connected to the drain of the first NMOS transistor. The source of the fourth PMOS transistor receives the third voltage level. The drain of the fourth PMOS transistor is connected to the gate of the third NMOS transistor. The gate of the fourth NMOS transistor is connected to the drain of the first PMOS transistor. The source of the fourth NMOS transistor receives the fourth voltage level. The drain of the fourth NMOS transistor is connected to the gate of the third PMOS transistor, wherein the drain of the fourth PMOS transistor and the drain of the fourth NMOS transistor are for generating a high-voltage level conversion signal.

In summary, the provided high-voltage level conversion circuit occupies smaller area of the transistors and achieves the same function of the conventional high-voltage level conversion circuit, wherein the function converts the input signal with low voltage to the output signal with higher voltage. According to the disclosed novel circuit design, the provided high-voltage level conversion circuit needs less circuit area, thus the manufacturing cost of the circuit could be reduced.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of the High-Voltage Level Conversion Circuit]

Figure 2A:
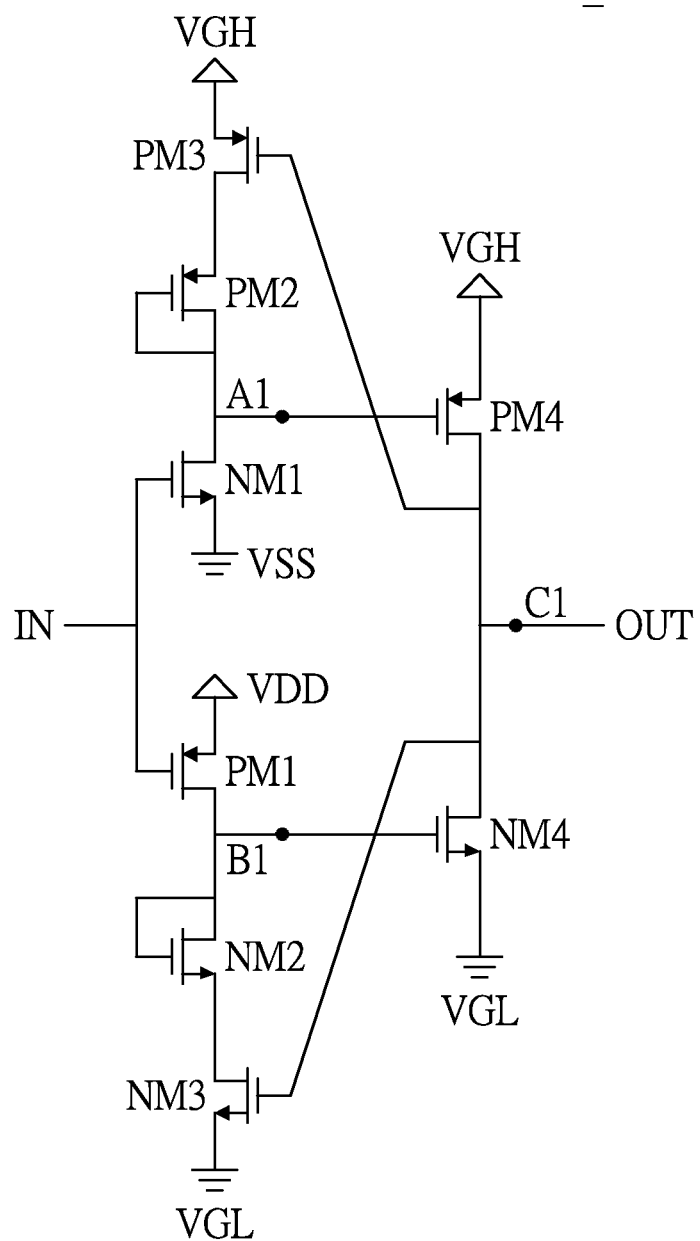
FIG. 2A shows a schematic of a high-voltage level conversion circuit according to an embodiment of the instant disclosure.

Please refer to FIG. 2A showing a schematic of a high-voltage level conversion circuit according to an embodiment of the instant disclosure. The high-voltage level conversion circuit 2 comprises a first NMOS transistor NM1, a first PMOS transistor PM1, a second NMOS transistor NM2, a second PMOS transistor PM2, a third PMOS transistor PM3, a third NMOS transistor NM3, a fourth PMOS transistor PM4, and a fourth NMOS transistor NM4. The high-voltage level conversion circuit 2 is connected to four voltages which are a first voltage level VSS, a second voltage level VDD, a third voltage level VGH and a fourth voltage level VGL respectively. The first voltage level VSS is lower than the second voltage level VDD, the second voltage level VDD is lower than the third voltage level VGH, and the fourth voltage level is lower than the first voltage level VSS.

The gate of the first NMOS transistor NM1 is connected to an input terminal IN for receiving an input signal. The source of the first NMOS transistor NM1 is connected to the first voltage level VSS, wherein the input signal from the input terminal IN comprises the first voltage level VSS and the second voltage level VDD. The gate of the first PMOS transistor PM1 is connected to the input terminal IN for receiving the input signal. The source of the first PMOS transistor PM1 is connected to the second voltage level VDD.

The drain of the second NMOS transistor NM2 is connected to the drain of the first PMOS transistor PM1. The gate and the drain of the second NMOS transistor NM2 are connected together, thus the voltage across the second NMOS transistor NM2 is at least a threshold voltage when the second NMOS transistor NM2 is conducted. The drain of the second PMOS transistor PM2 is connected to the drain of the first NMOS transistor NM1. The gate and the drain of the second PMOS transistor PM2 are connected together, thus the voltage across the second PMOS transistor PM2 is at least a threshold voltage when the second PMOS transistor is conducted. It is worth mentioning that, in this embodiment, the voltage across the second NMOS transistor NM2 when the second NMOS transistor NM2 is conducted may be the same as the voltage across the second PMOS transistor NM2 when the second PMOS transistor PM2 is conducted, for example the same threshold voltage Vth.

The drain of the third PMOS transistor PM3 is connected to the source of the second PMOS transistor PM2. The source of the third PMOS transistor PM3 is connected to the third voltage level VGH. The drain of the third NMOS transistor NM3 is connected the source of the second NMOS transistor NM2. The source of the third NMOS transistor NM3 is connected to the fourth voltage level VGL.

The gate of the fourth PMOS transistor PM4 is connected to the drain of the first NMOS transistor NM1. The source of the fourth PMOS transistor PM4 receives the third voltage level VGH. The drain of the fourth PMOS transistor PM4 is connected to the gate of the third NMOS transistor NM3. The gate of the fourth NMOS transistor NM4 is connected to the drain of the first PMOS transistor PM1. The source of the fourth NMOS transistor NM4 receives the fourth voltage level VGL. The drain of the fourth NMOS transistor NM4 is connected to the gate of the third PMOS transistor PM3.

It is worth mentioning that the drain of the fourth PMOS transistor PM4 and the drain of the fourth NMOS transistor NM4 are for generating a high-voltage level conversion signal. In order to provide the high-voltage level conversion signal according to the drain voltage of the fourth PMOS transistor PM4 and the drain voltage of the fourth NMOS transistor NM4, the instant disclosure provides three exemplary embodiments.

In this embodiment, the source of the fourth transistor PMOS transistor PM4 is connected to the third voltage level VGH. The source of the fourth NMOS transistor NM4 is connected to the fourth voltage level VGL. The drain of the fourth NMOS transistor NM4 is connected to the gate of the third NMOS transistor NM3. The drain of the fourth NMOS transistor NM4 is connected to the drain of the fourth PMOS transistor PM4 for being an output terminal OUT (which is the node C1), and the output terminal OUT provides the high-voltage level conversion signal.

Figure 2B:
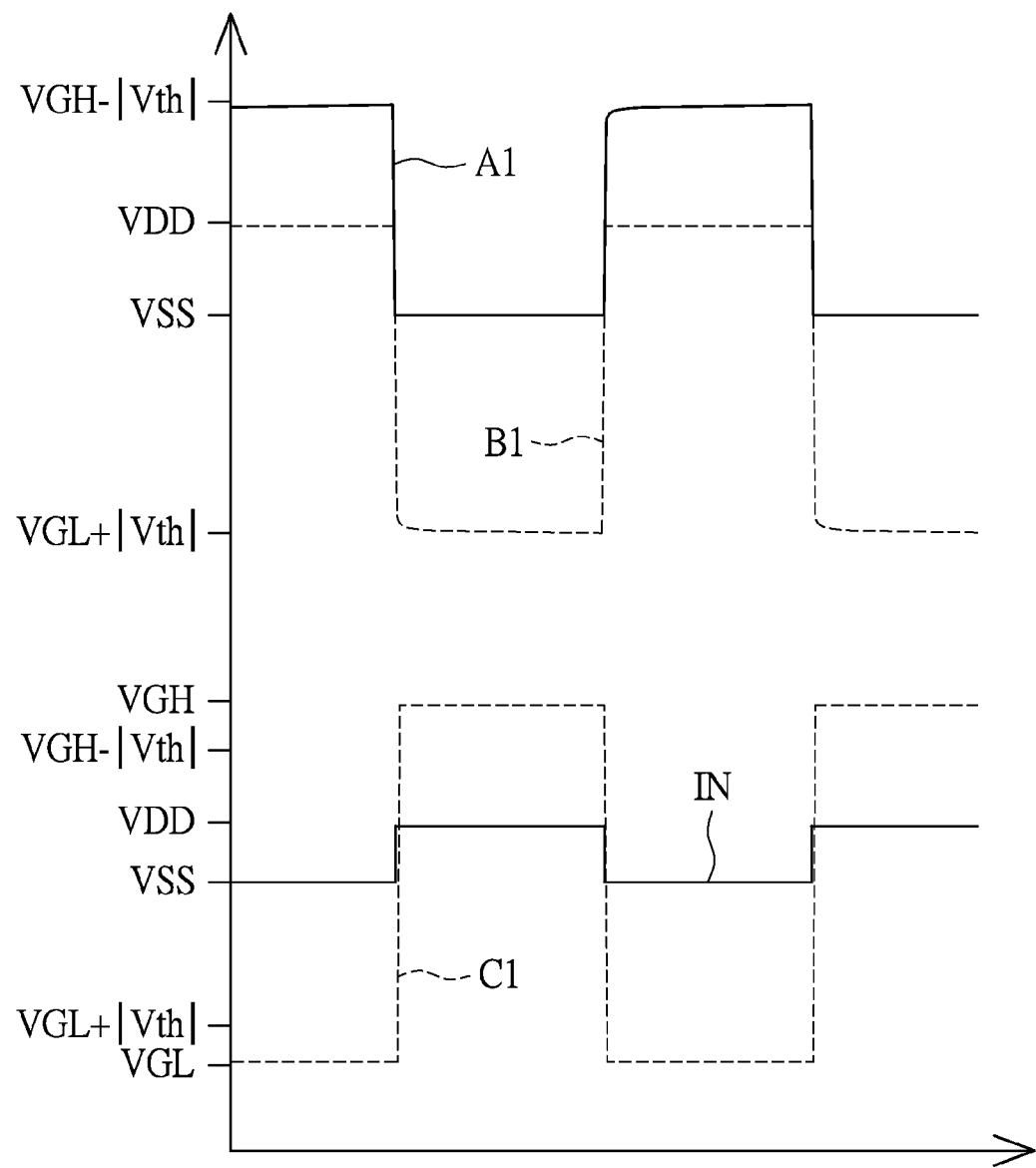
FIG. 2B shows a wave diagram of a high-voltage level conversion circuit according to an embodiment of the instant disclosure.

Please refer to FIG. 2A in conjunction with FIG. 2B, FIG. 2B shows a wave diagram of a high-voltage level conversion circuit according to an embodiment of the instant disclosure. Then we further explain the operation of the high-voltage level conversion circuit 2. Because the input signal of the input terminal IN may be the first voltage level VSS or the second voltage level VDD, these two conditions are respectively described thereafter.

When the input signal changes from the first voltage level VSS to the second voltage level VDD, the first NMOS transistor NM1 is turned on and the first PMOS transistor PM1 is turned off, then the voltage of the drain of the first NMOS transistor NM1 is gradually pulled down to the first voltage level VSS (that is, referring to FIG. 2B, the situation when the voltage of the node A1 decreases from a higher voltage to the first voltage level VSS), and the fourth PMOS transistor PM4 is turned on to pull up the voltage of the output terminal OUT so as to cause the third NMOS transistor NM3 to be turned on, thus the voltage of the drain of the first PMOS transistor PM1 is pulled down to the fourth voltage level VGL added with the threshold voltage |Vth| (that is, referring to FIG. 2B, the situation when the voltage of the node B1 decreases from a higher voltage to the voltage VGL+|Vth|) in order to turn off the fourth NMOS transistor NM4 for pulling up the voltage of the output terminal OUT to the third voltage level VGH. Further, when the voltage of the output terminal OUT is pulled up to the third voltage VGH, the third PMOS transistor PM3 is turned off. The waveform of the output terminal OUT indicated by the node C1 can be seen in FIG. 2B.

On the other hand, when the input signal changes from the second voltage level VDD to the first voltage level VSS, the first NMOS transistor NM1 is turned off and the first PMOS transistor PM1 is turned on, then the voltage of the drain of the third NMOS transistor NM3 is pulled up to the second voltage level VDD (that is, referring to FIG. 2B, the situation when the voltage of the node B1 increases from a lower voltage to the second voltage level VDD), and the fourth NMOS transistor NM4 is turned on to pull down the voltage of the output terminal OUT so as to cause the third PMOS transistor PM3 to be turned on, thus the voltage of the drain of the first NMOS transistor NM1 is pulled up to the third voltage level VGH minus the threshold voltage |Vth| (that is, referring to FIG. 2B, the situation when the voltage of the node A1 increases from a lower voltage to the voltage VGL−|Vth|) in order to turn off the fourth PMOS transistor PM4 for pulling down the voltage of the output terminal OUT to the fourth voltage level VGL. Further, when the voltage of the output terminal OUT is pulled down to the fourth voltage level VGL, the third NMOS transistor NM3 is turned off.

Figure 1:
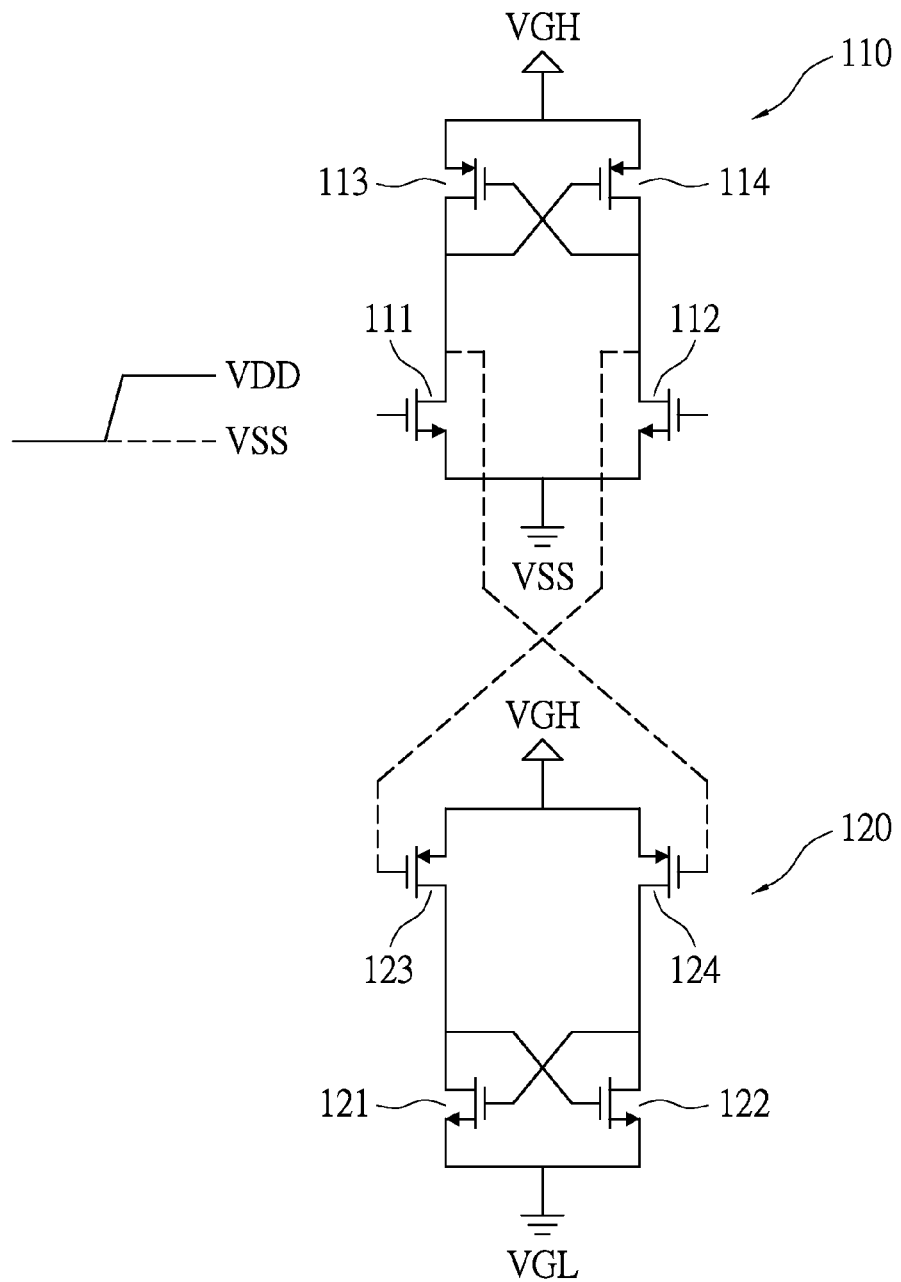
FIG. 1 shows a schematic of a conventional high-voltage level conversion circuit.

The circuit in this embodiment could decrease the required circuit area of the first NMOS transistor NM1 and the first PMOS transistor PM1 in the input portion of the circuit, and the transition ability and response speed of the circuit could be substantially maintained. Meanwhile, the overall circuit area (occupied by all transistors) of the high-voltage level conversion circuit 2 is also smaller than the circuit area occupied by the conventional high-voltage level conversion circuit 1 (shown in FIG. 1).

[Another Embodiment of the High-Voltage Level Conversion Circuit]

Figure 3A:
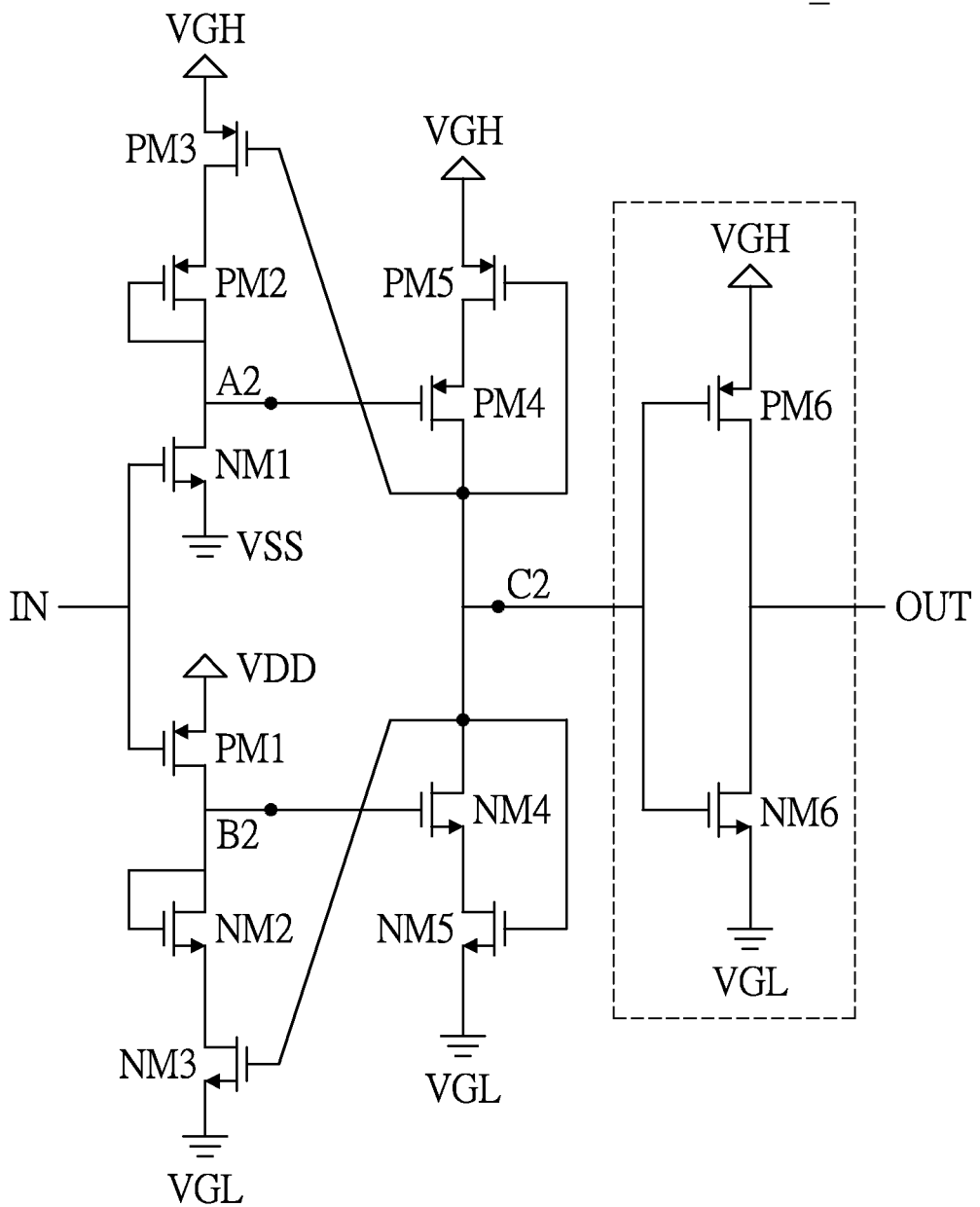
FIG. 3A shows a schematic of a high-voltage level conversion circuit according to another embodiment of the instant disclosure.
Figure 3B:
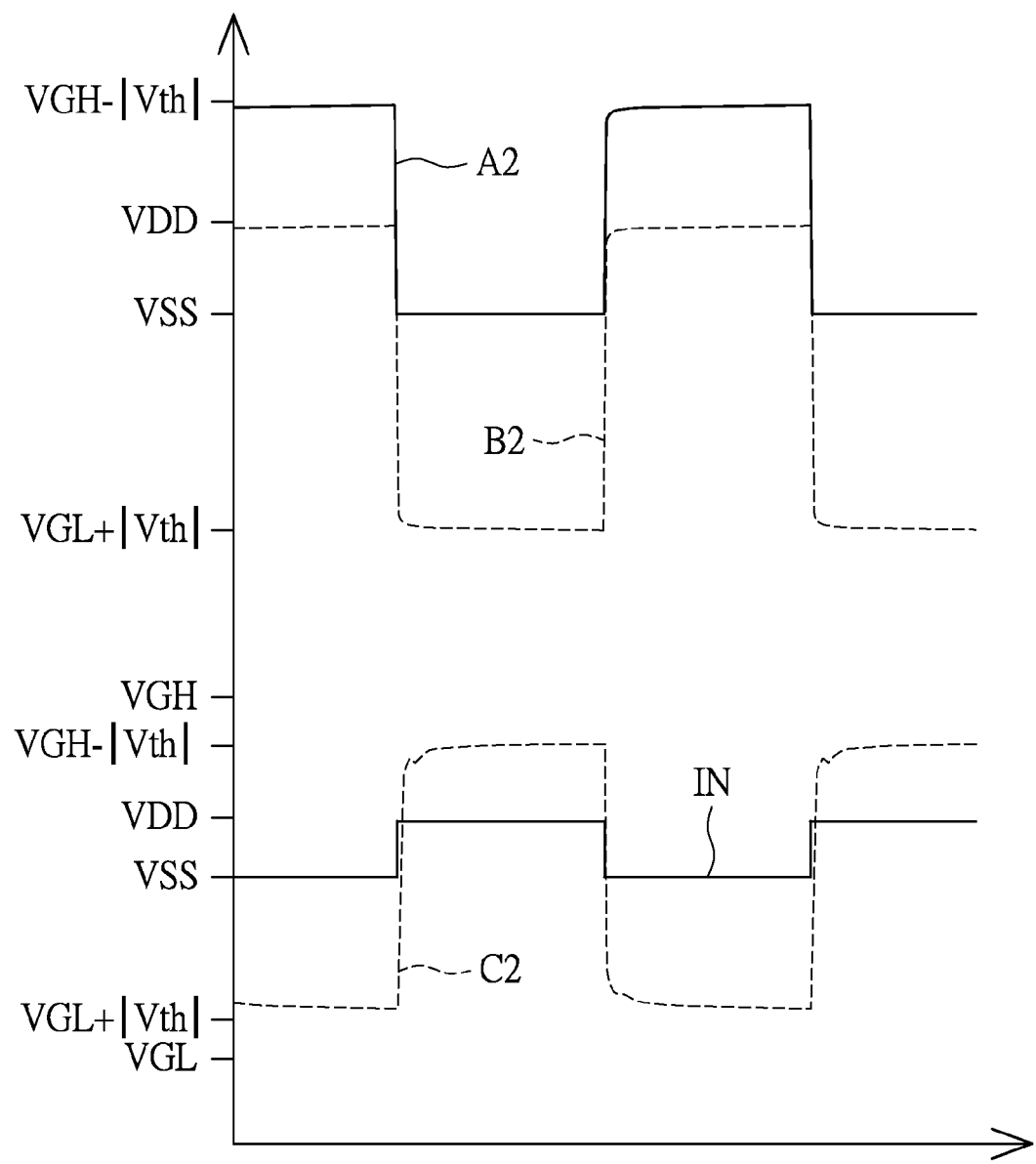
FIG. 3B shows a wave diagram of a high-voltage level conversion circuit according to another embodiment of the instant disclosure.

Please refer to FIG. 3A in conjunction with FIG. 3B, FIG. 3A shows a schematic of a high-voltage level conversion circuit according to another embodiment of the instant disclosure, and FIG. 3B shows a wave diagram of a high-voltage level conversion circuit according to another embodiment of the instant disclosure. The high-voltage level conversion circuit 3 of FIG. 3A is significantly identical to the high-voltage level conversion circuit 2 shown in FIG. 2A except for differences specified in the follows. A fifth PMOS transistor PM5, a fifth NMOS transistor NM5, a sixth PMOS transistor PM6 and a sixth NMOS transistor NM6 are added to the high-voltage level conversion circuit 3. The sixth PMOS transistor PM6 and the sixth NMOS transistor NM6 constitute the buffer of the output terminal OUT, thus the signal of the output terminal OUT is just the inversion signal of the node C2 shown in FIG. 3A.

In this embodiment, in order to cause the voltage of the drain of the fourth PMOS transistor PM4 and the voltage of the drain of the fourth NMOS transistor NM4 to generate the high-voltage level conversion signal, the drain of the fourth PMOS transistor PM4 is connected to the drain of the fourth NMOS transistor NM4 (that is the same with the previous embodiment) for generating the high-voltage level conversion signal.

The gate of the fifth PMOS transistor PM5 is connected to the drain of the fourth PMOS transistor PM4. The drain of the fifth PMOS transistor PM5 is connected to the source of the fourth PMOS transistor PM4. The source of the fifth PMOS transistor PM5 is connected to the third voltage level. It is worth mentioning that, in this embodiment, the source of the fourth PMOS transistor PM4 is not directly connected to the third voltage level VGH, but the source of the fourth PMOS transistor PM4 receives the third voltage level VGH via the fifth PMOS transistor PM5.

The gate of the fifth NMOS transistor NM5 is connected to the drain of the fourth NMOS transistor NM4. The drain of the fifth NMOS transistor NM5 is connected to the source of the fourth NMOS transistor NM4. The source of the fifth NMOS transistor NM5 is connected to the fourth voltage level VGL. It is worth mentioning that, the source of the fourth NMOS transistor NM4 is not directly connected to the fourth voltage level VGL, but the source of the fourth NMOS transistor NM4 receives the fourth voltage level VGL via the fifth NMOS transistor NM5.

The source of the sixth PMOS transistor PM6 is connected to the third voltage level VGH. The gate of the sixth PMOS transistor PM6 is connected to the drain of the fourth PMOS transistor PM4. The source of the sixth NMOS transistor NM6 is connected to the fourth voltage level VGL. The gate of the sixth NMOS transistor NM6 is connected to the drain of the fourth NMOS transistor NM4. The drain of the sixth NMOS transistor NM6 is connected to the drain of the sixth PMOS transistor PM6 for being the output terminal OUT. The sixth PMOS transistor PM6 and the sixth NMOS transistor NM6 constitute the buffer of the output stage.

Compared with the circuit of the previous embodiment shown in FIG. 2, this embodiment's circuit further decreases the circuit area of the first NMOS transistor NM1 and the first PMOS transistor PM1, and the transition ability and response speed of the circuit can be substantially maintained. Meanwhile, the overall circuit area (occupied by all transistors) of the high-voltage level conversion circuit 3 is also smaller than the circuit area occupied by the high-voltage level conversion circuit 2 (shown in FIG. 2A). That is, the circuit area occupied by the added fifth NMOS transistor NM5, the fifth PMOS transistor PM5, the sixth NMOS transistor NM6 and the sixth PMOS transistor PM6 can be smaller than the reduced area of the first NMOS transistor NM1 and the first PMOS transistor PM1.

[Another Embodiment of the High-Voltage Level Conversion Circuit]

Figure 4A:
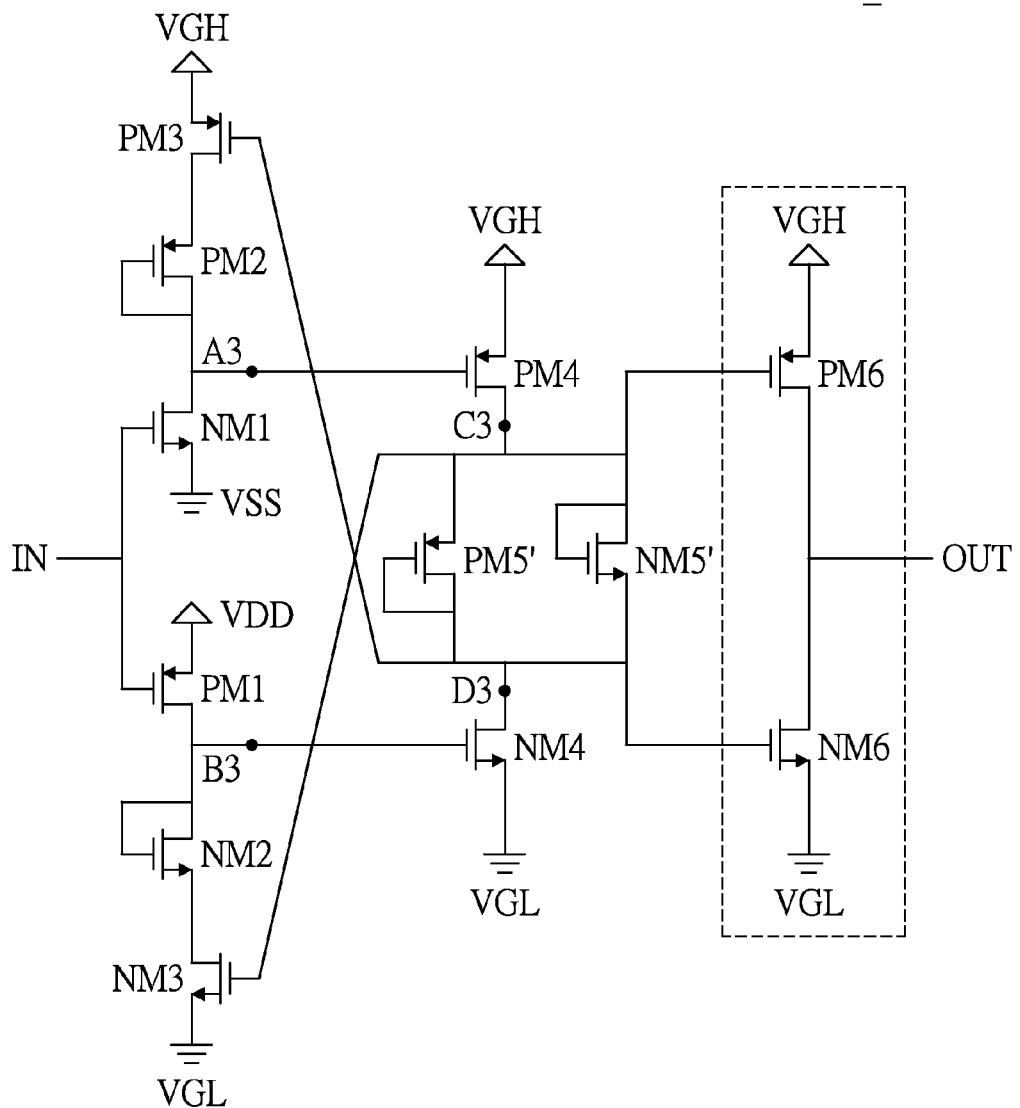
FIG. 4A shows a schematic of a high-voltage level conversion circuit according to another embodiment of the instant disclosure.
Figure 4B:
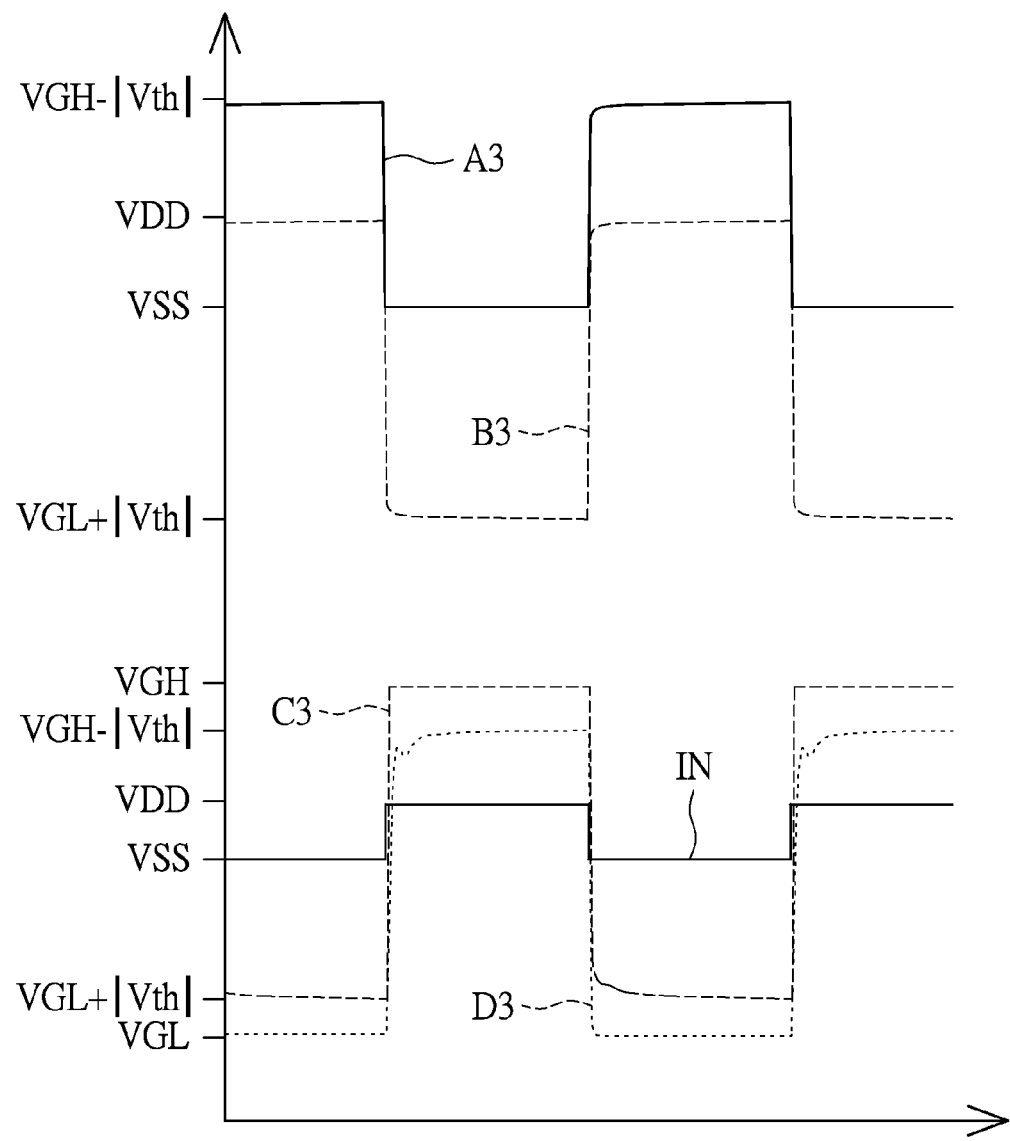
FIG. 4B shows a waveform of a high-voltage level conversion circuit according to another embodiment of the instant disclosure.

Please refer to FIG. 4A in conjunction with FIG. 4B, FIG. 4A shows a schematic of a high-voltage level conversion circuit according to another embodiment of the instant disclosure, and FIG. 4B shows a wave diagram of a high-voltage level conversion circuit according to another embodiment of the instant disclosure. The high-voltage level conversion circuit 4 of FIG. 4A is significantly identical to the high-voltage level conversion circuit 2 shown in FIG. 2A except for differences specified in the follows. A fifth PMOS transistor PM5', a fifth NMOS transistor NM5', a sixth PMOS transistor PM6 and a sixth NMOS transistor NM6 are added to the high-voltage level conversion circuit 4. The sixth PMOS transistor PM6 and the sixth NMOS transistor NM6 constitute the buffer of the output terminal OUT, thus the signal of the output terminal OUT is just the inversion signals of the nodes C3 and D3 shown in FIG. 4A. It is worth mentioning that, the drain of the fourth PMOS transistor PM4 is connected to the gate of the third NMOS transistor NM3, and the drain of the fourth NMOS transistor NM4 is connected to the gate of the third PMOS transistor PM3 (that is the same with the high-voltage level conversion circuit 2 of FIG. 2A).

In this embodiment, for causing the voltage of the drain of the fourth PMOS transistor PM4 and the voltage of the drain of the fourth NMOS transistor NM4 to generate the high-voltage level conversion signal, different from the previous embodiments, the drain of the fourth NMOS transistor NM4 and the drain of the fourth PMOS transistor PM4 are not connected. The fifth PMOS transistor PM5' and the fifth NMOS transistor NM5' are connected between the drain of the fourth NMOS transistor NM4 (which is the node C3) and the drain of the fourth PMOS transistor PM4 (which is the node D3). Additionally, in this embodiment, the source of the fourth PMOS transistor PM4 is directly connected to the third voltage level VGH, and the source of the fourth NMOS transistor NM4 is directly connected to the fourth voltage level VGL (that is the same with the embodiment of FIG. 2A).

The gate and the drain of the fifth PMOS transistor PM5' is connected to the drain of the fourth NMOS transistor NM4 (which is the node C3). The source of the fifth PMOS transistor PM5' is connected to the drain of the fourth PMOS transistor PM4. The gate and the drain of the fifth NMOS transistor NM5' is connected to the drain of the fourth PMOS transistor PM4 (which is the node D3). The source of the fifth NMOS transistor NM5' is connected to the drain of the fourth NMOS transistor NM4.

The source of the sixth PMOS transistor PM6 is connected to the third voltage level VGH. The gate of the sixth PMOS transistor PM6 is connected to the drain of the fourth PMOS transistor PM4. The source of the sixth NMOS transistor NM6 is connected to the fourth voltage level VGL. The gate of the sixth NMOS transistor NM6 is connected to the drain of the fourth NMOS transistor NM4. The drain of the sixth NMOS transistor NM6 is connected to the drain of the sixth PMOS transistor PM6 for being the output terminal OUT. The sixth PMOS transistor PM6 and the sixth NMOS transistor NM6 constitute the buffer of the output stage.

Compared with the circuit of previous embodiment shown in FIG. 2, this embodiment's circuit further decreases the circuit area of the first NMOS transistor NM1 and the first PMOS transistor PM1, and the transition ability and response speed of the circuit can be substantially maintained. Meanwhile, the overall circuit area of the high-voltage level conversion circuit 4 is also smaller than the circuit area occupied by the high-voltage level conversion circuit 2 (shown in FIG. 2A). That is, the circuit area occupied by the added fifth NMOS transistor nM5', the fifth PMOS transistor PM5', the sixth NMOS transistor NM6 and the sixth PMOS transistor PM6 can be smaller than the reduced area of the first NMOS transistor NM1 and the first PMOS transistor PM1.

According to above descriptions, the provided high-voltage level conversion circuit occupies a smaller area of the transistors and achieves the same function of the conventional high-voltage level conversion circuit, wherein the function converts the input signal with low voltage to the output signal with higher voltage. According to the disclosed novel circuit design, while reducing the area of the first NMOS transistor NM1 and the first PMOS transistor PM1 in the input portion the provided high-voltage level conversion circuit needs less circuit area, therefore the manufacturing cost of the circuit can be reduced.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:
1. A high-voltage level conversion circuit comprising:
a first NMOS transistor, the gate of the first NMOS transistor connected to an input terminal for receiving an input signal, the source of the first NMOS transistor connected to a first voltage level, wherein the input signal comprises the first voltage level and a second voltage level;
a first PMOS transistor, the gate of the first PMOS transistor connected to the input terminal for receiving the input signal, the source of the first PMOS transistor connected to the second voltage level;
a second NMOS transistor, the drain of the second NMOS transistor connected to the drain of the first PMOS transistor, the gate and the drain of the second NMOS transistor connected together, thus the voltage across the second NMOS transistor being at least a threshold voltage when the second NMOS transistor is conducted;
a second PMOS transistor, the drain of the second PMOS transistor connected to the drain of the first NMOS transistor, the gate and the drain of the second PMOS transistor connected together, thus the voltage across the second PMOS transistor being at least a threshold voltage when the second PMOS transistor is conducted;
a third PMOS transistor, the drain of the third PMOS transistor connected to the source of the second PMOS transistor, the source of the third PMOS transistor connected to a third voltage level;
a third NMOS transistor, the drain of the third NMOS transistor connected the source of the second NMOS transistor, the source of the third NMOS transistor connected to a fourth voltage level;
a fourth PMOS transistor, the gate of the fourth PMOS transistor connected to the drain of the first NMOS transistor, the source of the fourth PMOS transistor receiving the third voltage level, the drain of the fourth PMOS transistor connected to the gate of the third NMOS transistor; and
a fourth NMOS transistor, the gate of the fourth NMOS transistor connected to the drain of the first PMOS transistor, the source of the fourth NMOS transistor receiving the fourth voltage level, the drain of the fourth NMOS transistor connected to the gate of the third PMOS transistor;
wherein the drain of the fourth PMOS transistor and the drain of the fourth NMOS transistor are for generating a high-voltage level conversion signal.

2. The high-voltage level conversion circuit according to claim 1, wherein the first voltage level is lower than the second voltage level, the second voltage level is lower than the third voltage level, the fourth voltage level is lower the first voltage level.

3. The high-voltage level conversion circuit according to claim 2, wherein the source of the fourth PMOS transistor is connected to the third voltage level, the source of the fourth NMOS transistor is connected to the fourth voltage level, the drain of the fourth NMOS transistor is connected to the drain of the fourth PMOS transistor for being an output terminal, the output terminal provides the high-voltage level conversion signal.

4. The high-voltage level conversion circuit according to claim 2, wherein when the input signal changes from the first voltage level to the second voltage level the first NMOS transistor is turned on and the first PMOS transistor is turned off, then the voltage of the drain of the first NMOS transistor is gradually pulled down to the first voltage level, and the fourth PMOS transistor is turned on to pull up the voltage of the output terminal so as to cause the third NMOS transistor to be turned on, thus the voltage of the drain of the first PMOS transistor is pulled down to the fourth voltage level added with the threshold voltage in order to turn off the fourth NMOS transistor for pulling up the voltage of the output terminal to the third voltage level.

5. The high-voltage level conversion circuit according to claim 4, wherein when the voltage of the output terminal is pulled up to the third voltage level, the third PMOS transistor is turned off.

6. The high-voltage level conversion circuit according to claim 2, wherein when the input signal changes from the second voltage level to the first voltage level, the first NMOS transistor is turned off and the first PMOS transistor is turned on, then the voltage of the drain of the third NMOS transistor is pulled up to the second voltage level, and the fourth NMOS transistor is turned on to pull down the voltage of the output terminal so as to cause the third PMOS transistor to be turned on, thus the voltage of the drain of the first NMOS transistor is pulled up to the third voltage level minus the threshold voltage in order to turn off the fourth PMOS transistor for pulling down the voltage of the output terminal to the fourth voltage level.

7. The high-voltage level conversion circuit according to claim 6, wherein when the voltage of the output terminal is pulled down to the fourth voltage level, the third NMOS transistor is turned off.

8. The high-voltage level conversion circuit according to claim 2, wherein the drain of the fourth NMOS transistor is connected to the drain of the fourth PMOS transistor for generating the high-voltage level conversion signal, the high-voltage level conversion circuit further comprises:
a fifth PMOS transistor, the gate of the fifth PMOS transistor connected to the drain of the fourth PMOS transistor, the drain of the fifth PMOS transistor connected to the source of the fourth PMOS transistor, the source of the fifth PMOS transistor connected to the third voltage level, wherein the source of the fourth PMOS transistor receives the third voltage level via the fifth PMOS transistor; and a fifth NMOS transistor, the gate of the fifth NMOS transistor connected to the drain of the fourth NMOS transistor, the drain of the fifth NMOS transistor connected to the source of the fourth NMOS transistor, the source of the fifth NMOS transistor connected to the fourth voltage level, wherein the source of the fourth NMOS transistor receives the fourth voltage level via the fifth NMOS transistor.

9. The high-voltage level conversion circuit according to claim 8, further comprising:
- a sixth PMOS transistor, the source of the sixth PMOS transistor connected to the third voltage level, the gate of the sixth PMOS transistor connected to the drain of the fourth PMOS transistor; and
- a sixth NMOS transistor, the source of the sixth NMOS transistor connected to the fourth voltage level, the gate of the sixth NMOS transistor connected to the drain of the fourth NMOS transistor, the drain of the sixth NMOS transistor connected to the drain of the sixth PMOS transistor for being an output terminal.

10. The high-voltage level conversion circuit according to claim 2, wherein the source of the fourth PMOS transistor is connected to the third voltage level, the source of the fourth NMOS transistor is connected to the fourth voltage level, the high-voltage level conversion circuit further comprises:
- a fifth PMOS transistor, the gate and the drain of the fifth PMOS transistor connected to the drain of the fourth NMOS transistor, the source of the fifth PMOS transistor connected to the drain of the fourth PMOS transistor;
- a fifth NMOS transistor, the gate and the drain of the fifth NMOS transistor connected to the drain of the fourth PMOS transistor, the source of the fifth NMOS transistor connected to the drain of the fourth NMOS transistor;
- a sixth PMOS transistor, the source of the sixth PMOS transistor connected to the third voltage level, the gate of the sixth PMOS transistor connected to the drain of the fourth PMOS transistor; and
- a sixth NMOS transistor, the source of the sixth NMOS transistor connected to the fourth voltage level, the gate of the sixth NMOS transistor connected to the drain of the fourth NMOS transistor, the drain of the sixth NMOS transistor connected to the drain of the sixth PMOS transistor for being an output terminal.

* * * * *